United States Patent
Sayka et al.

(10) Patent No.: US 6,766,813 B1
(45) Date of Patent: Jul. 27, 2004

(54) APPARATUS AND METHOD FOR CLEANING A WAFER

(75) Inventors: Anthony Sayka, San Antonio, TX (US); Dhiraj K. Sardar, San Antonio, TX (US); Frederick J. Barrera, San Antonio, TX (US); Raylon M. Yow, San Antonio, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 09/630,211

(22) Filed: Aug. 1, 2000

(51) Int. Cl.$^7$ .................................................. B08B 3/12
(52) U.S. Cl. ........................ 134/148; 134/153; 134/157; 134/184; 134/902
(58) Field of Search ............................... 134/184, 186, 134/187, 140, 144, 147, 148, 149, 153, 157, 902

(56) References Cited

U.S. PATENT DOCUMENTS

| | | | |
|---|---|---|---|
| 4,064,885 A | | 12/1977 | Dussault et al. ............... 134/58 |
| 4,178,188 A | | 12/1979 | Dussault et al. ................ 134/1 |
| 4,501,285 A | | 2/1985 | Irwin et al. .................... 134/58 |
| 4,655,162 A | * | 4/1987 | Kameyama |
| 5,100,476 A | | 3/1992 | Mase et al. ..................... 134/1 |
| 5,131,460 A | * | 7/1992 | Krueger |
| 5,254,237 A | * | 10/1993 | Sanper et al. |
| 5,368,054 A | | 11/1994 | Koretsky et al. ........... 134/153 |
| 5,494,526 A | * | 2/1996 | Paranjpe |
| 5,520,784 A | * | 5/1996 | Ward |
| 5,562,778 A | | 10/1996 | Koretsky et al. ............... 134/1 |
| 5,569,502 A | * | 10/1996 | Koinuma et al. |
| 5,795,399 A | * | 8/1998 | Hasegawa et al. |
| 5,825,470 A | * | 10/1998 | Miya et al. |
| 5,849,135 A | * | 12/1998 | Selwyn |
| 5,858,475 A | * | 1/1999 | Chiu |
| 5,925,410 A | * | 7/1999 | Akram et al. |
| 5,927,308 A | * | 7/1999 | Kim |
| 6,092,937 A | * | 7/2000 | Snodgrass et al. |
| 6,194,317 B1 | * | 2/2001 | Kaisaki et al. |
| 6,196,900 B1 | * | 3/2001 | Zhang et al. |
| 6,261,433 B1 | * | 7/2001 | Landau |
| 6,355,397 B1 | * | 3/2002 | Chiu |

FOREIGN PATENT DOCUMENTS

| | | | |
|---|---|---|---|
| JP | 63-85090 | * | 4/1988 |
| JP | 63-153265 | * | 6/1988 |
| JP | 1-95522 | * | 4/1989 |
| JP | 2-19463 | * | 1/1990 |
| JP | 2-281626 | * | 11/1990 |
| JP | 3-14221 | * | 1/1991 |
| JP | 3-148110 | * | 6/1991 |
| JP | 3-169012 | * | 7/1991 |
| JP | 4-163916 | * | 6/1992 |
| JP | 5-304140 | * | 1/1993 |
| JP | 5-320898 | * | 2/1993 |
| JP | 5-136045 | * | 6/1993 |
| JP | 6-48602 | * | 2/1994 |
| JP | 9-139345 | * | 5/1997 |
| JP | 10-44000 | * | 2/1998 |
| JP | 63-96925 | * | 4/1998 |
| JP | 2000-83362 | * | 3/2000 |
| JP | 2000-138188 | * | 5/2000 |

OTHER PUBLICATIONS

WO 97/14178 Apr. 1997.*

* cited by examiner

*Primary Examiner*—Frankie L. Stinson
(74) *Attorney, Agent, or Firm*—Gardere Wynne Sewell LLP

(57) ABSTRACT

The present invention provides a method of cleaning a wafer. The method comprises suspending the wafer beneath a vacuum chuck. The vacuum chuck contains an acoustic wave emitter. The acoustic wave emitter is positioned within the vacuum chuck to prevent the acoustic wave emitter from contacting the surface of the wafer. The method further comprises applying acoustic waves to the wafer.

23 Claims, 2 Drawing Sheets

APPARATUS AND METHOD FOR CLEANING A WAFER

TECHNICAL FIELD OF INVENTION

The present invention relates generally to the field of wafer production and, more particularly, to an apparatus and methods for cleaning a wafer.

BACKGROUND

The problem of wafer contamination has existed since the birth of wafer manufacturing. The yield on fully processed silicon wafers is inversely related to the defect density of the wafers. One way to decrease defect density is to use cleaning techniques that remove particle contaminants.

A problem faced by those working in the wafer manufacturing industry, however is to find an effective way to remove particles from wafers with efficiency and without damage to the wafers. Small particles are difficult to remove from wafers, for example, because, of the strong electrostatic forces between the particles and the substrate.

Modern wafer manufacturing facilities use stringent contamination control protocols. These protocols can include the use of clean room suits, latex gloves, highly purified ventilation systems, and the like. In combination with these protocols, modern manufacturing facilities use various methods of cleaning wafers. The most common methods used to clean contaminated wafers usually involve pressurized water jet scrubs, rotating wafer scrubbers, wet chemical baths and rinses and similar systems. These processes, however, are prone to damaging the wafer. Additionally, the chemical processes have inherent dangers associated with the use of chemicals such as sulfuric acid, ammonium hydroxide, isopropyl alcohol, and the like.

SUMMARY OF THE INVENTION

Other features and advantages of the present invention shall be apparent to those of ordinary skill in the art upon reference to the following detailed description taken in conjunction with the accompanying drawings.

The present invention-provides a method of cleaning a wafer. The method comprises suspending the wafer beneath a vacuum chuck. The vacuum chuck contains an acoustic wave emitter. The acoustic wave emitter is positioned within the vacuum chuck to prevent the acoustic wave emitter from contacting the surface of the wafer. The method further comprises applying acoustic waves to the wafer.

The present invention further provides a wafer cleaning apparatus. The apparatus can include a vacuum chuck and an acoustic wave emitter. The acoustic wave emitter can be contained within the vacuum chuck and positioned to prevent the acoustic wave emitter from contacting the surface of the wafer.

The present invention also provides a method of cleaning a wafer. The method can include the steps of suspending the wafer beneath a vacuum chuck. The vacuum chuck can contain an acoustic wave emitter. The acoustic wave emitter can be positioned within the vacuum chuck to prevent the acoustic wave emitter from contacting the surface of the wafer. The method can further include applying acoustic waves to the wafer. Additionally, the method can include directing a stream of cleaning liquid at a surface of the wafer, the stream of cleaning liquid having an angle of incidence of less than about 10 degrees.

The present invention can further provide a method of cleaning a wafer. The method can include the steps of mounting the wafer to a vacuum chuck. The vacuum chuck can contain an acoustic wave emitter. The acoustic wave emitter can be positioned within the vacuum chuck to prevent the acoustic wave emitter from contacting the surface of the wafer. The method can further include applying acoustic waves to the wafer.

The present invention may also provide a method of cleaning a wafer. The method can include the steps of mounting the wafer to a vacuum chuck. The vacuum chuck can contain an acoustic wave emitter. The acoustic wave emitter can be positioned within the vacuum chuck to prevent the acoustic wave emitter from contacting the surface of the wafer. The method can further include applying acoustic waves to the wafer. Additionally, the method can include directing a stream of water at a surface of the wafer, the stream of water having an angle of incidence of less than about 10 degrees.

BRIEF DESCRIPTION OF THE DRAWINGS

For a more complete understanding of the features and advantages of the present invention, reference is now made to the detailed description of the invention along with the accompanying figures in which corresponding numerals in the different figures refer to corresponding parts and in which.

DETAILED DESCRIPTION OF THE INVENTION

While the making and using of various embodiments of the present invention are discussed in detail below, it should be appreciated that the present invention provides many applicable inventive concepts that may be embodied in a wide variety of specific contexts. The specific embodiments discussed herein are merely illustrative of specific ways to make and use the invention and do not delimit the scope of the invention.

Figure 1:
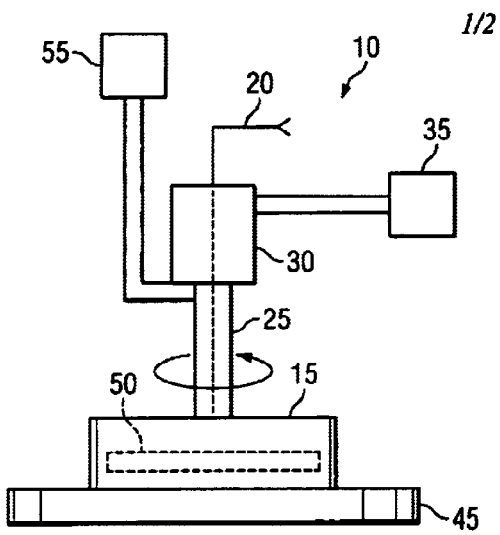
FIG. 1 is a schematic view of a typical embodiment of an apparatus of the present invention.

Referring now to FIG. 1, an apparatus of the present invention is shown as 10. The apparatus 10 can include a vacuum chuck 15. A vacuum chuck is a common device for holding a wafer, such as a silicon wafer, patterned wafer, or semiconductor wafer in place while the wafer is being spun and cleaned. A spindle 25 can be attached to the vacuum chuck 15. The spindle 25 allows the vacuum chuck to be rotated 360° upon its center axis. Contained within the spindle 25 can be power lines, power supply wires and the internal vacuum line 20. The internal vacuum line 20 allows the vacuum chuck 15 to form a vacuum seal between itself and the wafer 45 during the cleaning process.

An electric motor 30 can be attached to the spindle 25. The electric motor 30 powers the spindle 25 and enables the vacuum chuck 15 to be rotated 360 degrees around its axis. A speed controller 35 can be attached to the electric motor 30. The speed controller 35 allows the spindle 25 to be rotated at varying speeds. By allowing for varying cleaning speeds, a more efficient cleaning process can be attained.

An acoustic wave emitter 50 can be contained within the vacuum chuck 15. The acoustic wave emitter 50 can lie beneath the surface of the vacuum chuck 15. The placement of the acoustic wave emitter 50 can be such that the acoustic wave emitter 50 will not directly contact the surface of the wafer 45. The acoustic wave emitter can be any commonly used piezoelectric element. An acoustic controller 55 can be attached to the acoustic wave emitter 50. The acoustic controller 55 can automatically vary the frequency of the acoustic waves produced by the acoustic wave emitter 50. This allows, for instance, during one cleaning cycle the frequency of the acoustic waves produced by the acoustic wave emitter 50 to vary, for example, from 0.1 MHz to 190 MHz. By allowing the acoustic wave emitter 50 to vary the frequency of the acoustic waves, maximum cleaning efficiency can be achieved. A greater cleaning efficiency occurs because some particle contaminants removed from the surface of the wafer 45 may vibrate resonately at a lower frequency and some may vibrate resonately at a higher frequency.

The apparatus 10 depicted in FIG. 1 shows the wafer 45 suspended beneath the vacuum chuck 15. It will be appreciated, however, that the apparatus 10 can be positioned such that the wafer 45 is positioned above the vacuum chuck 15. By positioning the wafer 45 beneath the vacuum chuck 15, the apparatus 10 allows gravity to assist in the removal of particles from the wafer 45.

Figure 2A:
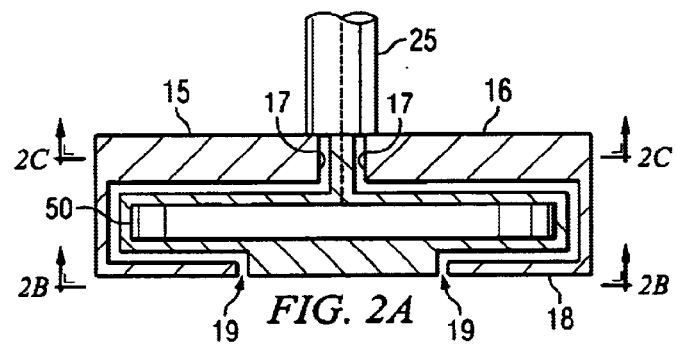
FIG. 2A is a schematic view, partially sectioned, of another embodiment of an apparatus of the present invention.

The assembly of the vacuum chuck 15 and the acoustic wave emitter 50 can be seen more easily in FIG. 2. As depicted in FIG. 2A, the acoustic wave emitter 50 can be contained fully with the vacuum chuck 15. The spindle can be attached to upper surface 16 of the vacuum chuck 15. The vacuum chuck 15 can include vacuum slots 17. The vacuum slots 17 allow the vacuum chuck 15 to form a suction between the vacuum chuck 15 and the wafer. The suction holds the wafer in place during the cleaning process. It should be noted that the vacuum slots can be positioned to avoid going through the acoustic wave emitter 50.

Figure 2B:
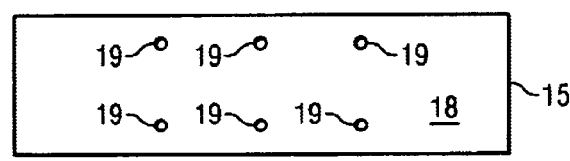
FIG. 2B,is a view taken from line 2B—2B of FIG. 2A.
Figure 2C:
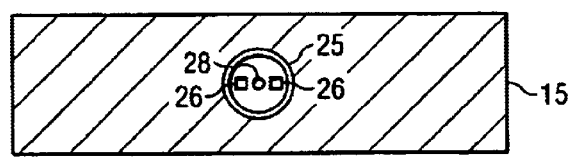
FIG. 2C is a view taken from line 2C—2C of FIG. 2A.

The vacuum chuck 15 can have openings 19 on the lower surface 18 of the vacuum chuck 15. The openings 19, as shown in FIG. 2B, allow the suction to form between the wafer and the vacuum chuck 15. As shown in FIG. 2C, the spindle 25 can contain vacuum tubes 26 and power Lines 28. The vacuum tubes 26 allow the suction to be present in the vacuum chuck 15. The power lines 28 enable the acoustic wave emitter 50 to generate the appropriate acoustic waves.

Figure 3:
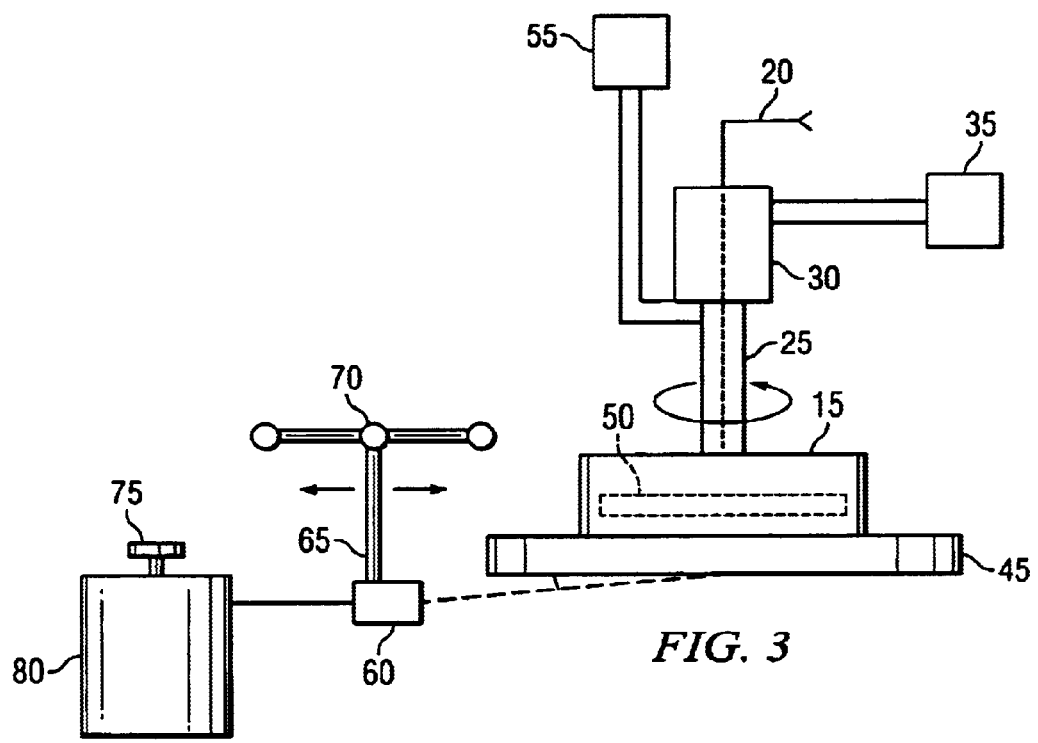
FIG. 3 is a schematic view similar to FIG. 1 and also showing the liquid spray part of wafer cleaning apparatus.

Referring now to FIG. 3, another embodiment of the apparatus of the present invention is shown. The apparatus can contain the same components as depicted in FIG. 1. As shown FIG. 3, however, a spray nozzle 60 can be positioned beneath the wafer 45. The spray nozzle 60 can be attached to a rod 65. The rod 65 can be attached to a roller shaft 70. By attaching the spray nozzle 60 to the rod 65 and roller shaft 70, the spray nozzle 60 can be pivoted from side to side. The motion caused by the roller shaft 70 allows the spray nozzle 60 to spray all points on the surface of the wafer 45. The spray nozzle 60 can be positioned such that the angle of incidence of the spray from the nozzle with the surface of the wafer 45 would be less than about 10 degrees. It will be appreciated, however, that larger or smaller angles may be used depending upon the pattern on the wafer and the particles to be removed. Likewise, it will be appreciated that the spray nozzle 60 can be operated in a manner where the angle of incidence between the spray nozzle 60 and the surface of the wafer 45 could be automatically changed during the cleaning process. Thus, for example, during one cleaning cycle, the angle of the spray from the spray nozzle could vary between about 5 degrees to about 20 degrees.

A pressure control valve 75 can be attached to the spray nozzle 60. The pressure control valve 75 controls the strength of the spray produced by the spray nozzle 60. The pressure control valve 75 can contain a liquid reservoir 80. The liquid reservoir 80 can hold either water or another suitable cleaning liquid used, for particle removal within the wafer industry.

Operator of the present invention may be understood by the following description. Referring to FIG. 3, a wafer 45 can be positioned beneath the vacuum chuck 15. As mentioned previously, however, the wafer 45 can be positioned such that it lies on top of the vacuum chuck 15 rather than being suspended beneath the vacuum chuck. Such a configuration can be accomplished by rotating the apparatus, as depicted in FIG. 3, 180 degrees.

After positioning the wafer 45 beneath the vacuum chuck 15, the vacuum line 20 can be energized causing a vacuum to form between the vacuum chuck 15 and the wafer 45. The vacuum generated by the vacuum line causes the wafer 45 to be pulled into the vacuum chuck 40, thereby holding the wafer 45 firmly in place.

After the wafer 45 has been properly positioned, the electric motor 30 can be engaged. The electric motor 30 allows the spindle 25 to rotate in a counterclockwise or clockwise direction. The speed with which the spindle 25 can rotate depends upon the programming of the speed controller 35. By incorporating a speed controller as part of the invention, the speed with which the spindle 25 and the wafer 45 can be rotated, can vary.

After engaging the electric motor 30 causing the wafer to rotate, the acoustic wave emitter 50 can be energized. The acoustic wave emitter 50 then begins to transmit acoustic energy throughout the wafer 45. The frequency with which the acoustic energy can be transmitted can vary. The variance can be accomplished by energizing the acoustic controller 55. The acoustic controller 55 will automatically vary the acoustic waves being transmitted by the acoustic wave emitter 50 during any one cleaning cycle. By enabling the acoustic wave emitter 50 to vary the frequency of the waves it transmits, the invention obtains maximum cleaning efficiency. For example, during one cleaning cycle, the frequency could be programmed to vary from 0.1 MHz to 190 MHz.

Once the acoustic wave emitter 50 has been energized and the wafer 45 experiences the acoustic cleaning process, then the spray nozzle 60 can be engaged. The spray nozzle 60 can project a sharp stream of liquid onto the surface of the wafer 45. By projecting the sharp stream of liquid onto the surface of the wafer 45, the invention allows for maximum cleaning potential. Although gravity and the acoustic waves may cause most, if not all, the particles to be removed from the surface of the wafer 45, there may be a need to assist in the removal of those particles with the use of a stream of cleaning liquid. It will be appreciated, that the smaller the angle that the stream is incident to the surface of the wafer 45, the more efficient the cleaning process becomes.

Once the spray nozzle 60 has been engaged, the roller shaft 70 begins to rotate the rod 65 attached to the spray nozzle 60. The rotation of the rod 65 causes the spray nozzle 60 to transgress the surface of the wafer 45. As the acoustic waves dislodge the contaminants from the wafer 45, the spray from the spray nozzle 60 assists in removing the contaminants and debris. Moreover, as the wafer 45 rotates all portions of the surface of the wafer 45 become exposed to both the acoustic wave energy and the spray stream from the spray nozzle.

The sequence described above can be varied to some extent without effecting the cleaning process. It should be noted that effective cleaning action is caused primarily by the combination of the variants in acoustic waves frequency applied throughout the wafer and the motion of the wafer. Due to the configuration of the apparatus, manual contact with the work pieces is avoided, thus providing superior results and precluding surface scratches and other materials to be introduced upon the delicate surface of the wafer, which is detrimental when the wafer becomes part of a delicate electronic circuit product.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A wafer cleaning apparatus comprising:
   a vacuum chuck;
   an acoustic wave emitter, the acoustic wave emitter being contained within the vacuum chuck and positioned to prevent the acoustic wave emitter from contacting a surface of a wafer, and
   an acoustic controller attached to the acoustic wave emitter, the acoustic controller being programmed to vary the frequency of acoustic waves transmitted by the acoustic wave emitter.

2. The wafer cleaning apparatus set forth in claim 1, including:
   a surface on said vacuum chuck for engagement with said wafer for suspending said wafer from said vacuum chuck; and
   apparatus for directing a stream of liquid at a surface of said wafer.

3. The wafer cleaning apparatus set forth in claim 2 including:
   a nozzle for directing said stream of liquid at said surface of said wafer, and means for supporting said nozzle for oscillation to direct said stream of liquid over said surface of said wafer.

4. The wafer cleaning apparatus set forth in claim 3 wherein:
   said means for supporting said nozzle is configured to orient said nozzle to direct said stream of liquid to said surface of said wafer at an angle of incidence with respect to said surface of said wafer of not more than about 10 degrees.

5. The wafer cleaning apparatus set forth in claim 1 wherein:
   said vacuum chuck is mounted on a rotatable spindle, said spindle being operably connected to an electric motor, and
   a speed controller operably connected to said motor for rotating said spindle at a selected variable speed.

6. The wafer cleaning apparatus set forth in claim 1 wherein:
   said vacuum chuck is mounted on a rotatable spindle, said spindle including at least one vacuum conduit for connection between a source of vacuum and said vacuum chuck and an electrical power conductor disposed within said spindle and operably connected to said acoustic wave emitter.

7. A wafer cleaning apparatus comprising:
   a vacuum chuck having a chuck body and a wafer mounting surface; vacuum conduit means extending within said body between a source of vacuum and said wafer mounting surface;
   an acoustic wave emitter disposed within said body and positioned to prevent contact with a surface of a wafer supported on said wafer mounting surface; and
   an acoustic controller operably connected to said acoustic wave emitter, said acoustic controller being operable to vary the frequency of acoustic waves transmitted by said acoustic wave emitter for cleaning said wafer.

8. The wafer cleaning apparatus set forth in claim 7, wherein:
   said wafer mounting surface is oriented for engagement with said wafer for suspending said wafer from said vacuum chuck.

9. The wafer cleaning apparatus set forth in claim 8 including:
   apparatus for directing a stream of liquid at a surface of said wafer while suspended from said vacuum chuck.

10. The wafer cleaning apparatus set forth in claim 8 including:
    a nozzle for directing said stream of liquid at said surface of said wafer, and
    means for supporting said nozzle for oscillation to direct said stream of liquid over said surface of said wafer.

11. The wafer cleaning apparatus set forth in claim 10 wherein:
    said means for supporting said nozzle is configured to orient said nozzle to direct said stream of liquid toward said surface of said wafer at an angle of incidence with respect to said surface of said wafer of not more than about 10 degrees.

12. The wafer cleaning apparatus set forth in claim 7 wherein:
    said vacuum chuck is mounted on a rotatable spindle, said spindle being operably connected to an electric motor; and
    a speed controller is operably connected to said motor for rotating said spindle at a selected variable speed.

13. The wafer cleaning apparatus set forth in claim 7 wherein:
    said vacuum chuck is mounted on a rotatable spindle, said spindle including at least one vacuum conduit for connection between a source of vacuum and said vacuum chuck and an electrical power conductor is disposed within said spindle and operably connected to said acoustic wave emitter.

14. A wafer cleaning apparatus comprising:
    a vacuum chuck including a chuck body having a wafer mounting surface for suspending a wafer therefrom;
    vacuum conduit means in said chuck body extending between a source of vacuum and said wafer mounting surface;
    an acoustic wave emitter disposed on chuck body and positioned to prevent contact with said wafer;
    an acoustic controller operably connected to said acoustic wave emitter to vary the frequency of acoustic waves transmitted by the acoustic wave emitter; and
    apparatus including a nozzle for directing a stream of liquid at a surface of said wafer at an acute angle of incidence with respect to said surface of said wafer.

15. The wafer cleaning apparatus set forth in claim 14 including:

means for supporting said nozzle for oscillation to direct said stream of liquid over said surface of said wafer.

16. The wafer cleaning apparatus set forth in claim 14 wherein:

said means for supporting said nozzle is configured to orient said nozzle to direct said stream of liquid toward said surface of said wafer at an angle of incidence with respect to said surface of said wafer of not more than about 10 degrees.

17. The wafer cleaning apparatus set forth in claim 14 wherein:

said vacuum chuck is mounted on a rotatable spindle, said spindle being operably connected to an electric motor; and a speed controller operably connected to said motor for rotating said spindle at a selected variable speed.

18. The wafer cleaning apparatus set forth in claim 17 including:

at least one vacuum conduit disposed within said spindle for connection between said source of vacuum and said vacuum chuck and an electrical power conductor disposed within said spindle and operably connected to said acoustic wave emitter.

19. A cleaning apparatus comprising:

a vacuum chuck having a chuck body and a wafer mounting surface;

vacuum conduit means extending within said body between a source of vacuum and said wafer mounting surface;

an acoustic wave emitter disposed within said body and positioned to prevent contact with a surface of a wafer supported on said wafer mounting surface;

an acoustic controller operably connected to said acoustic wave emitter, said acoustic controller being operable to cause acoustic waves to be transmitted by said acoustic wave emitter for cleaning said wafer;

an apparatus for directing a stream of liquid at a surface of said wafer while suspended from said vacuum chuck nozzle for directing said stream of liquid at said surface of said wafer; and means for supporting said nozzle for oscillation to direct said stream of liquid over said surface of said wafer.

20. The wafer cleaning apparatus set forth in claim 19 wherein:

said means for supporting said nozzle is configured to orient said nozzle to direct said stream of liquid toward said surface of said wafer at an angle of incidence with respect to said surface of said wafer of not more than about 10 degrees.

21. A cleaning apparatus comprising:

a vacuum chuck having a chuck body and a wafer mounting surface;

vacuum conduit means extending within said body between a source of vacuum and said wafer mounting surface;

an acoustic wave emitter disposed within said body and positioned to prevent contact with a surface of a wafer supported on said wafer mounting surface;

an acoustic controller operably connected to said acoustic wave emitter, said acoustic controller being operable to cause acoustic waves to be transmitted by said acoustic wave emitter for cleaning said wafer;

an apparatus for directing a stream of liquid at a surface of said wafer while suspended from said vacuum chuck;

a nozzle for directing said stream of liquid at said surface of said wafer; and a means for supporting said nozzle for oscillation to direct said stream of liquid over said surface of said wafer.

22. The wafer cleaning apparatus set forth in claim 21 wherein:

said means for supporting said nozzle is configured to orient said nozzle to direct said stream of liquid toward said surface of said wafer at an angle of incidence with respect to said surface of said wafer of not more than about 10 degrees.

23. A cleaning apparatus comprising:

a vacuum chuck having a chuck body and a wafer mounting surface;

vacuum conduit means extending within said body between a source of vacuum and said wafer mounting surface;

an acoustic wave emitter disposed within said body and positioned to prevent contact with a surface of a wafer supported on said wafer mounting surface;

an acoustic controller operably connected to said acoustic wave emitter, said acoustic controller being operable to cause acoustic waves to be transmitted by said acoustic wave emitter for cleaning said wafer;

an apparatus for directing a stream of liquid at a surface of said wafer while suspended from said vacuum chuck;

a nozzle for directing said stream of liquid at said surface of said wafer; and a means for supporting said nozzle for oscillation to direct said stream of liquid over said surface of said wafer, wherein said means for supporting said nozzle is configured to orient said nozzle to direct said stream of liquid toward said surface of said wafer at an angle of incidence with respect to said surface of said wafer of not more than about 10 degrees.

* * * * *